United States Patent [19]
Van Zalinge

[11] Patent Number: 6,124,746
[45] Date of Patent: Sep. 26, 2000

[54] ADJUSTABLE DELAY CIRCUIT

[75] Inventor: Klaas Van Zalinge, Meylan, France

[73] Assignee: STMicroelectronics S.A., Gentilly, France

[21] Appl. No.: 09/124,817

[22] Filed: Jul. 29, 1998

[30] Foreign Application Priority Data

Jul. 31, 1997 [FR] France .................... 97 10033

[51] Int. Cl.[7] .......................... H03K 5/159; H03K 5/153
[52] U.S. Cl. ........................ 327/280; 327/287; 327/283
[58] Field of Search ............................... 327/250, 263,
327/276, 277, 278, 280, 285, 287, 268, 283

[56] References Cited

U.S. PATENT DOCUMENTS

| | | | |
|---|---|---|---|
| 4,620,312 | 10/1986 | Yamashita | 327/176 |
| 4,812,687 | 3/1989 | Larson et al. | 327/263 |
| 4,893,036 | 1/1990 | Hester et al. | 327/262 |
| 5,025,176 | 6/1991 | Takeno | 327/58 |
| 5,066,877 | 11/1991 | Hamano et al. | 327/280 |
| 5,461,335 | 10/1995 | Tsuchiva | 327/280 |
| 5,594,377 | 1/1997 | Choi et al. | 327/278 |

Primary Examiner—Timothy P. Callahan
Assistant Examiner—Terry L. Englund
Attorney, Agent, or Firm—Wolf, Greenfield & Sacks, P.C.; James H. Morris; Theodore E. Galanthay

[57] ABSTRACT

An adjustable delay circuit, for a logic input signal, comprises circuitry for charging a capacitance at a first constant current when the logic signal switches to a first logic state; circuitry for discharging the capacitance at a second constant current when the logic signal switches to the second logic state; circuitry for stopping charging and discharging of the capacitance between the moment when the voltage across the capacitance reaches a high threshold or a low threshold and a subsequent switching of the logic signal; and a first comparator connected to switch the state of an output signal when the voltage across the capacitance crosses a third threshold included between the first and second thresholds.

9 Claims, 2 Drawing Sheets

ADJUSTABLE DELAY CIRCUIT

BACKGROUND OF THE INVENTION

1. Field of the Invention

The present invention relates to a circuit which allows adjustment of the delay of a logic signal by means of a control signal.

2. Discussion of the Related Art

Analog phase shifters are often used as adjustable delay circuits due to their ease of adjustment. However, when such a phase shifter is used with logic signals, it has the drawback of reducing the slopes and the amplitude of the logic signals, due to its limited band-width. Thus, a phase shifter cannot be used for adjusting the delay of high frequency logic signals, unless it has an unreasonably high band-width.

Analog delay lines have the same drawbacks as phase shifters.

In digital delay lines, the input signal is sampled, and the samples are stored so that they can be provided subsequently with the desired delay. For the delay to be accurate enough, the sampling frequency should be much higher than the frequency of the input signal. This precludes the use of digital delay lines for high frequency logic signals.

In a so-called quasi-linear delay circuit, a capacitor is alternately charged and discharged at a constant current as the input signal switches from one state to the other. The delayed signal results from a comparison of the voltage across the capacitor with a threshold.

However, such a circuit can only be used when the input signal has a constant duty ratio of 50%, otherwise the voltage across the capacitor would diverge.

SUMMARY OF THE INVENTION

An object of the invention is to provide an accurate adjustable delay circuit which may operate on signals of particularly high frequency.

This and other objects are achieved by an adjustable delay circuit for a logic input signal, comprising means for charging a capacitance at a first constant current when the logic signal switches to a first logic state; means for discharging the capacitance at a second constant current when the logic signal switches to the second logic state; means for stopping charging and discharging of the capacitance between the moment when the voltage across the capacitance reaches a high threshold or a low threshold and a subsequent switching of the logic signal; and a first comparator connected to switch the state of an output signal when the voltage across the capacitance crosses a third threshold comprised between the first and second thresholds.

According to an embodiment of the invention, the delay is adjusted by setting the difference between the high and low thresholds.

According to an embodiment of the invention, the delay is adjusted by setting the values of the first and second constant currents.

According to an embodiment of the invention, the means for charging, the means for discharging, and the means for stopping comprise first and second equal value constant current sources coupled to a first supply terminal; a first switch controlled by the logic signal for selectively coupling the first current source to the first or second terminal of the capacitance; a flip-flop set to a first state when the high threshold is reached and set to a second state when the low threshold is reached; a second switch controlled by the flip-flop for selectively coupling the second current source to the first or second terminal of the capacitance; and third and fourth constant current sources having values equal to those of the first and second current sources, each coupling a second supply terminal to a respective terminal of said capacitance.

According to an embodiment of the invention, the circuit comprises a second comparator for setting the flip-flop to the first state, receiving the voltage on the first terminal of the capacitance and a first reference voltage; and a third comparator for setting the flip-flop to the second state, receiving the voltage on the second terminal of the capacitance and said first reference voltage.

According to an embodiment of the invention, the first comparator receives the voltages on the first and second terminals of the capacitance.

According to an embodiment of the invention, the first and second constant currents are equal.

According to an embodiment of the invention, each of the first and second constant current sources has two distinct values selectable by the state of the logic input signal.

According to an embodiment of the invention, the capacitance is comprised of two series-connected capacitors, the connection node between the two capacitors being coupled to a reference voltage.

BRIEF DESCRIPTION OF THE DRAWINGS

The foregoing and other objects, features, aspects and advantages of the invention will become apparent from the following detailed description of embodiments, given by way of illustration and not of limitation with reference to the accompanying drawings, among which.

DETAILED DESCRIPTION

An adjustable delay circuit according to the invention is of the quasi-linear type, i.e. it operates by alternately charging and discharging a capacitor at a constant current as the input signal switches from one state to the other. Such a delay circuit is only usable with logic signals and with analog signals which include information in their transitions.

The main aspect of the invention is to stop charging or discharging the capacitor when the voltage across this capacitor reaches a high threshold or a low threshold, and to remain stopped until the next change of the input signal. The high and low thresholds and the charge and discharge currents are chosen so that each threshold is always reached before a next change of the input signal.

The delayed signal is obtained by comparing the voltage across the capacitor to a threshold comprised between the high and low thresholds, preferably half-way between these thresholds.

Figure 1:
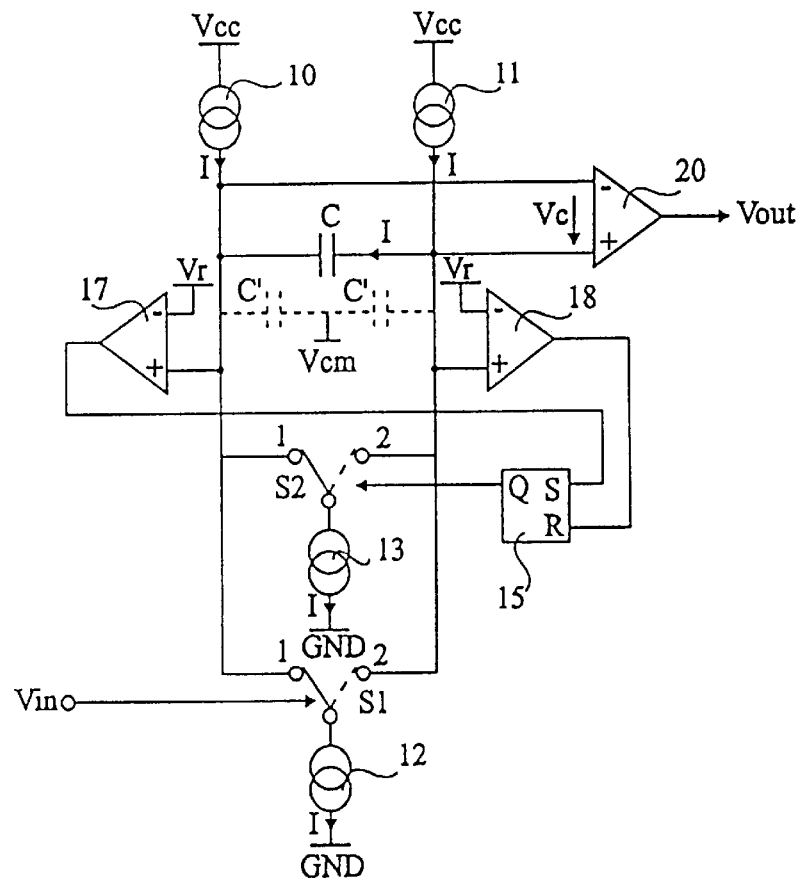
FIG. 1 shows an embodiment of an adjustable delay circuit according to the invention.

FIG. 1 shows a first embodiment of a delay circuit according to the invention operating as mentioned above. It comprises two constant current sources 10 and 11, each coupling one of the terminals of a capacitor C to a high supply voltage Vcc. A constant current source 12 has one terminal connected to a low supply voltage GND and its other terminal is selectively connected to one of the two terminals of capacitor C by a switch S1. Switch S1 is controlled by the input signal Vin. A constant current source 13 is, like source 12, connected to voltage GND and to either one of the terminals of capacitor C through a switch S2. Switch S2 is controlled by the output of a flip-flop 15, for example an RS flip-flop.

Current sources 10 and 11 deliver the same constant current I, while current sources 12 and 13 sink this same current I.

A first terminal of capacitor C is connected to the non-inverting input of a comparator 17 whose output is connected to the set input S of flip-flop 15. The inverting input of comparator 17 receives a constant reference voltage Vr. Similarly, the second terminal of capacitor C is connected to the non-inverting input of a comparator 18. The output of comparator 18 is connected to the reset input R of flip-flop 15. The inverting input of comparator 18 receives the same reference voltage Vr as comparator 17.

The delayed signal Vout is provided by a comparator 20 whose inverting input is connected to the first terminal of capacitor C and whose non-inverting input is connected to the second terminal of capacitor C. Since both terminals of capacitor C are only connected to high impedance elements, their common mode may float. To avoid this, capacitor C is preferably replaced with the circuit shown in dotted lines comprising two series connected capacitors C'. The connection node between these capacitors C' is coupled to a fixed common mode voltage Vcm, which may be one of the supply voltages. Such a connection does not change the operating principle of the circuit.

Figure 2:
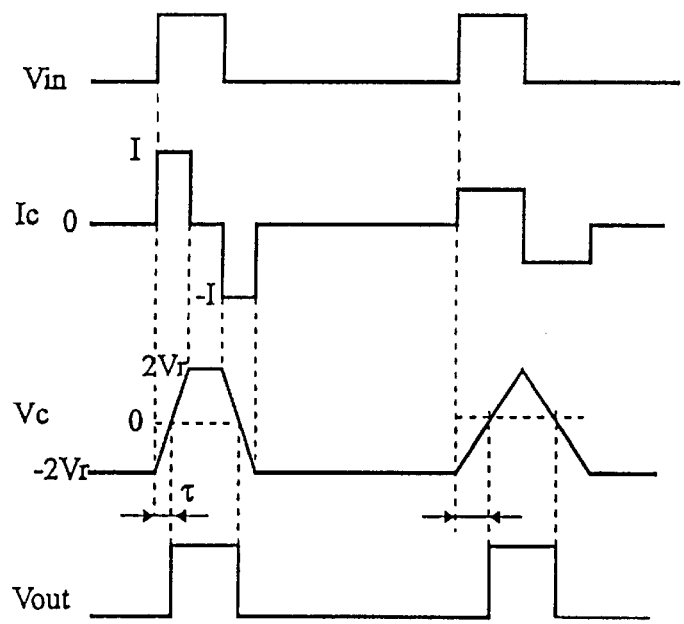
FIG. 2 shows signals over time for illustrating the operation of the delay circuit of FIG. 1.

FIG. 2 illustrates the input signal Vin, the current Ic in capacitor C, the voltage Vc across capacitor C and the output signal Vout.

The polarities of voltage Vc and current Ic are those indicated in FIG. 1, i.e. Ic is positive when it flows from right to left in capacitor C and Vc is the voltage between the non-inverting input and the inverting input of comparator 20.

For sake of clarity, input signal Vin is shown as having sharp edges. Signal Vin, especially at high frequency, will have smoother edges. Its logic states are then determined by the switching threshold of a logic gate, for example an inverter.

Initially, the input signal Vin is low and the current Ic in capacitor C is zero, which means that voltage Vc is constant, here equal, for example, to a low threshold −2Vr. Signal Vout is low. It is assumed that switch S1 is in the position indicated by 2 and that switch S2 is in the shown position indicated by 1. Flip-flop 15 is in the set state.

In this initial state, the current delivered by source 10 entirely flows through switch S2 into source 13, while the current delivered by source 11 entirely flows through switch S1 into source 12. No current flows through capacitor C.

When signal Vin goes high, switch S1 assumes shown position 1. Then, the current delivered by source 10 directly flows into sources 12 and 13, while the current I delivered by source 11 flows into sources 12 and 13 through capacitor C. The current in capacitor C thus switches to a positive value I. As a consequence, the voltage Vc across this capacitor increases linearly, starting from its initial value −2Vr. As soon as voltage Vc starts increasing, the output of comparator 17 goes low. When the voltage Vc across capacitor C becomes zero, comparator 20 switches, whereby signal Vout goes high. The rising edge of signal Vout is thus delayed from the rising edge of signal Vin by a value τ, equal to 2Vr·C/I.

When the voltage at the non-inverting input of comparator 18 reaches value Vr, which is when the voltage Vc across capacitor C reaches value 2Vr, the output of comparator 18 goes high and resets flip-flop 15. Switch S2 then assumes position 2, where the current of source 11 directly flows into source 13, while the current of source 10 still flows into source 12 through switch S1. No current flows through capacitor C, whereby voltage Vc remains constant.

When signal Vin goes low again, S1 is set back to position 2, whereby the current of source 11 is directly delivered to sources 12 and 13, while the current of source 10 is delivered to sources 12 and 13 through capacitor C. A constant negative current −I then flows through capacitor C, whereby voltage Vc decreases linearly from value 2Vr. As soon as voltage Vc starts decreasing, the output of comparator 18 goes low.

When voltage Vc reaches zero again, comparator 20 switches, causing signal Vout to go low.

Finally, when the voltage at the non-inverting input of comparator 17 reaches value Vr, which is when voltage Vc reaches value −2Vr, the output of comparator 17 goes high and sets flip-flop 15. Switch S2 is set back to position 1, and the circuit is back in its initial conditions.

It will be noted that, since comparator 20 switches when voltage Vc is half-way between values −2Vr and 2Vr, and since the charge and discharge currents (±I), determining the rising and falling slopes of voltage Vc, are identical, the same delay τ is obtained for the rising edges and for the falling edges of signal Vin, which is desirable in most applications.

As shown by the expression of the delay τ given above, this delay is proportional to voltage Vr and inversely proportional to value I. Thus, each of the values Vr and I may be used to adjust the delay. The use of value Vr will be preferred because it allows a proportional adjustment. (The delay also depends on value C, but this value is not adjustable.)

The embodiment of FIG. 1 is particularly advantageous for producing a uniform delay (a same delay τ for both the rising and falling edges of the input signal), especially when voltage Vr is used to adjust the delay. Indeed, it will need no accurate reference voltages or other circuitry for setting the high and low threshold values 2Vr and −2Vr symmetrically with respect to the switching point of comparator 20.

The right portion of FIG. 2 illustrates a limit operating condition. The current I is reduced to a value such that voltage Vc takes an entire time interval between a rising edge and the next falling edge of signal Vin to increase from value −2Vr up to value 2Vr. This corresponds to the maximum delay setting. Indeed, if the charge and discharge currents are further reduced, in this example, voltage Vc will not reach value 2Vr before it starts decreasing again, whereby the desirable symmetry is lost. In other words, value 4Vr·C/I should be smaller than the minimum time interval separating two consecutive edges of the input signal Vin. The maximum obtainable delay, visible in the right portion of FIG. 2, is half this minimum time interval. (This corresponds to the maximum phase shift of 90° obtainable with a phase shifter operating on a 50% duty cycle signal). In order to obtain a greater delay, comparator 20 may have a hysteresis cycle whose high threshold is slightly below threshold 2Vr and whose low threshold is slightly above threshold −2Vr. The maximum delay then approaches value 4Vr·C/I. The hysteresis cycle should be symmetrical to obtain an exact but delayed copy of the input signal. If a still greater delay is needed, several delay circuits will be cascaded.

In some cases, it may be useful to have different delays for the rising edges and the falling edges of the input signal Vin. One possibility to achieve this is to offset the switching point of comparator 20. However, this would increase one of the delays and decrease the other of the same amount and would make an independent adjustment of the two delays difficult.

Figure 3:
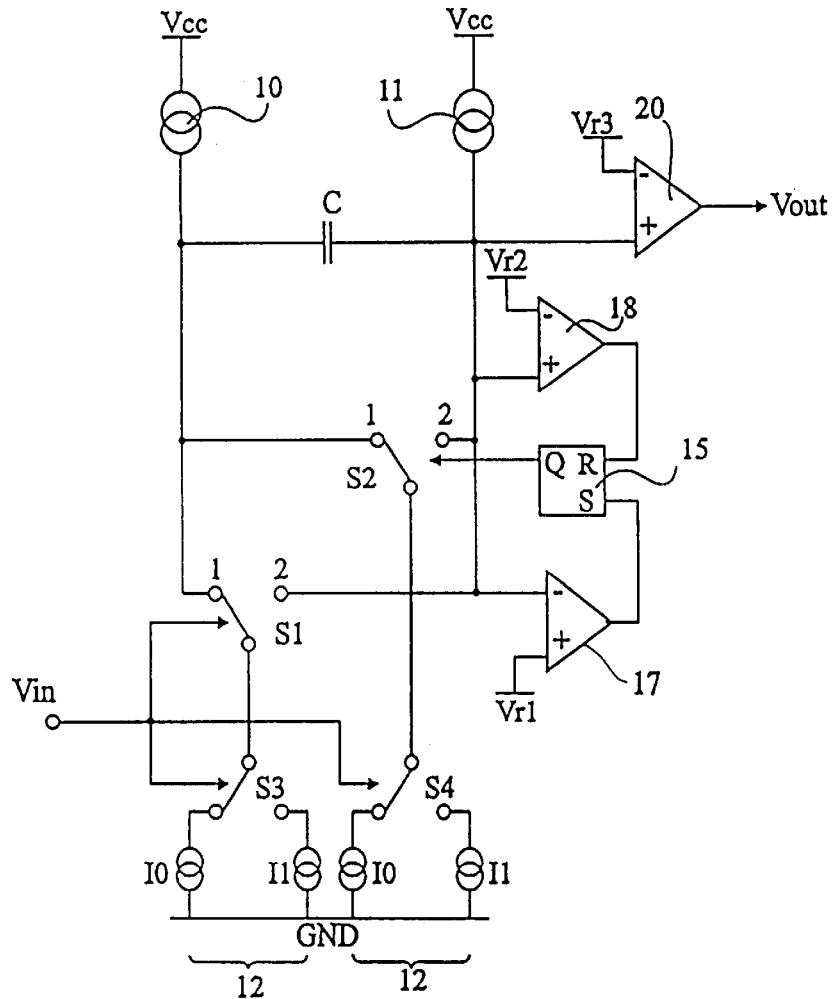
FIG. 3 shows an alternative embodiment of the delay circuit of FIG. 1.

FIG. 3 shows an alternative of the embodiment of FIG. 1, which allows independent adjustment the delays for the rising edges and falling edges. It also shows an alternative connection of comparators 17, 18 and 20.

In this alternative, each of current sources 12 and 13 of FIG. 1 is replaced with two current sources of distinct values I0 and I1. In "modified" current source 12, a switch S3 controlled by signal Vin selects one of the currents I0 and I1 for provision to switch S1. In "modified" current source 13, a switch S4, also controlled by signal Vin, selects one of the currents I0 and I1 for provision to switch S2. Switches S3 and S4 are connected so that they provide the same value I0 or I1 to switches S1 and S2. Moreover, current sources 10 and 11 should track the value I0 or I1 selected by switches S3 and S4. For this purpose, they may be controlled by a common mode feedback loop. Each of them may also be replaced, like current sources 12 and 13, with two current sources selectable by a switch controlled by signal Vin.

With this configuration, in the shown position of the switches which corresponds, like in FIG. 1, to a rising edge of signal Vin, a positive current I0 will flow through capacitor C from right to left causing voltage Vc to increase with a slope proportional to value I0.

After a falling edge of signal Vin, all the switches S1–S4 are in the other position, whereby a negative current –I1 flows through capacitor C (from left to right), causing voltage Vc to decrease with a different slope, proportional to current I1.

Comparators 17, 18 and 20 may be connected as in FIG. 1. The connection shown in FIG. 3 illustrates an alternative. Comparator 18 remains connected as in FIG. 1 and its inverting input receives a high reference voltage Vr2. The inverting input of comparator 17 is connected to the same terminal of capacitor C than comparator 18. The non-inverting input of comparator 17 receives a low reference voltage Vr1.

The inverting input of comparator 20, instead of being connected to a terminal of capacitor C, receives a third reference voltage Vr3 which, when a symmetrical operation is desired, should be half-way between reference voltages Vr1 and Vr2.

The operation of the circuit is similar to that shown in FIG. 2, except that values –2Vr, 2Vr and 0 for voltage Vc are replaced with values Vr1, Vr2 and Vr3.

This alternative connection of the comparators is less advantageous than that in FIG. 1, because it needs more reference voltages which are moreover dependent on each other to insure a symmetrical operation.

Figure 4:
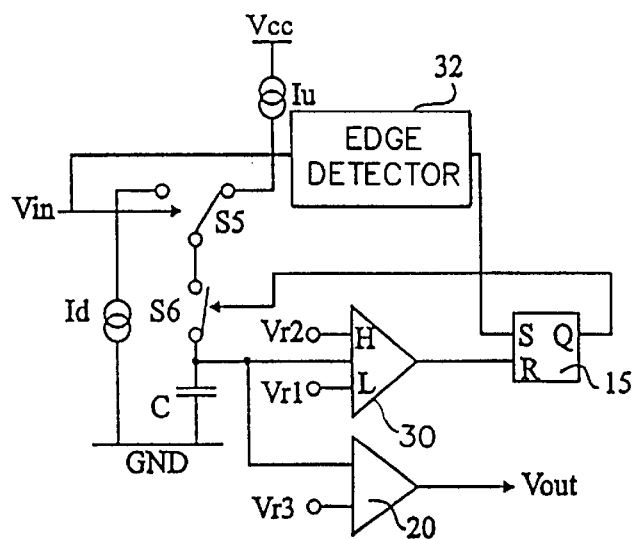
FIG. 4 shows another embodiment of an adjustable delay circuit according to the invention.

FIG. 4 shows another embodiment of an adjustable delay circuit according to the invention having a different structure than that of FIGS. 1 and 3, but operating according to the same main principle. The circuit comprises a capacitor C having one terminal connected to a supply voltage, for example ground GND, and the other terminal selectively connected to a discharge current source Id or to a charge current source Iu through a switch S5 controlled by the input voltage Vin. The current source Id is moreover connected to ground while current source Iu is moreover connected to the supply voltage terminal Vcc. A switch S6, controlled by a flip-flop 15, is placed between capacitor C and switch S5.

The voltage on capacitor C is analyzed by a normal comparator 20 delivering the output signal Vout, and by a window comparator 30. Comparator 20 plays the same role as comparator 20 of FIG. 3, i.e. it compares the voltage of capacitor C to a reference voltage Vr3. The window comparator 30 is connected to reset flip-flop 15, causing the opening of switch S6, when the voltage on capacitor C exceeds a high threshold Vr2 or goes below a low threshold Vr1. An edge detector 32 is connected to set flip-flop 15 at each edge of signal Vin, causing switch S6 to close.

In operation, upon a rising edge of signal Vin, switch S5 is positioned as shown in FIG. 4 and flip-flop 15 is set by edge detector 32 so that switch S6 closes. Capacitor C is charged by current source Iu.

When the voltage on capacitor C reaches value Vr3, the output signal Vout switches and, when it reaches value Vr2, flip-flop 15 is reset causing the opening of switch S6 and capacitor C to stop charging.

Upon a subsequent falling edge of signal Vin, switch S5 selects discharge current Id and flip-flop 15 is set by edge detector 32, causing switch S6 to close again. Therefore, capacitor C is discharged by current source Id. When the voltage on capacitor C reaches value Vr3, comparator 20 switches again. Finally, when value Vr1 is reached, comparator 30 resets flip-flop 15, whereby switch S6 is opened and capacitor C stops discharging.

In practice, this embodiment does not work as well as that of FIG. 1, because current source Iu or Id is periodically disconnected causing its saturation. Connecting the current source again takes a certain time, which slows down the operation and causes incertainty in the desired delay.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. An adjustable delay circuit for a logic input signal, comprising:

means for charging a capacitance at a first constant current when the logic signal switches to a first logic state;

means for discharging the capacitance at a second constant current when the logic signal switches to the second logic state;

means for stopping the charging and discharging of the capacitance between the moment when voltage across the capacitance reaches a high threshold or a low threshold, and a subsequent switching of the logic signal; and a first comparator connected to switch the state of an output signal when the voltage across the capacitance crosses a third threshold between the first and second thresholds.

2. The adjustable delay circuit according to claim 1, wherein the delay is adjusted by setting the difference between the high and low thresholds.

3. The adjustable delay circuit according to claim 1, wherein the delay is adjusted by setting the values of the first and second constant currents.

4. The adjustable delay circuit according to any of claims 1 to 3, wherein said means for charging, said means for discharging and said means for stopping comprise:

first and second equal value constant current sources coupled to a first supply terminal;

a first switch controlled by the logic signal for selectively coupling the first current source to a first or second terminal of the capacitance;

a flip-flop set to a first state when the high threshold is reached and set to a second state when the low threshold is reached;

a second switch controlled by the flip-flop for selectively coupling the second current source to the first or second terminal of the capacitance; and third and fourth constant current sources having values equal to those of the first and second current sources, each coupling a second supply terminal to a respective terminal of said capacitance.

5. The adjustable delay circuit according to claim 4, comprising:

a second comparator for setting the flip-flop to the first state, receiving the voltage on the first terminal of the capacitance and a first reference voltage; and a third comparator for setting the flip-flop to the second state, receiving the voltage on the second terminal of the capacitance and said first reference voltage.

6. The adjustable delay circuit according to claim 4, wherein the first comparator receives the voltage across the first and second terminals of the capacitance.

7. The adjustable delay circuit according to claim 1, wherein the first and second constant currents are equal.

8. The adjustable delay circuit according to claim 4, wherein each of the first and second constant current sources has two distinct values selectable by the state of the logic input signal.

9. The adjustable delay circuit according to claim 4, wherein the capacitance is comprised of two series-connected capacitors, a connection node between the two capacitors being coupled to a reference voltage.

* * * * *